(12) United States Patent
Takasaki

(10) Patent No.: US 11,424,150 B2
(45) Date of Patent: Aug. 23, 2022

(54) SEMICONDUCTOR MANUFACTURING APPARATUS MEMBER AND METHOD FOR MANUFACTURING THE SAME

(71) Applicant: NGK INSULATORS, LTD., Nagoya (JP)

(72) Inventor: Hideaki Takasaki, Handa (JP)

(73) Assignee: NGK Insulators, Ltd., Nagoya (JP)

(*) Notice: Subject to any disclaimer, the term of this patent is extended or adjusted under 35 U.S.C. 154(b) by 430 days.

(21) Appl. No.: 16/391,636

(22) Filed: Apr. 23, 2019

(65) Prior Publication Data

US 2019/0252231 A1  Aug. 15, 2019

Related U.S. Application Data

(63) Continuation of application No. PCT/JP2018/022504, filed on Jun. 13, 2018.

(30) Foreign Application Priority Data

Jul. 6, 2017  (JP) .............................. JP2017-132363

(51) Int. Cl.
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67109* (2013.01); *H01L 21/6831* (2013.01); *H01L 21/68757* (2013.01); *H01L 21/68785* (2013.01)

(58) Field of Classification Search
CPC ... H01L 21/67; H01L 21/683; H01L 21/6831; H01L 21/6833; H01L 21/68757; H01L 21/68785; H01L 21/67109; H02N 13/00

(Continued)

(56) References Cited

U.S. PATENT DOCUMENTS

2008/0254220 A1* 10/2008 Tian .................... B32B 37/12
427/271
2013/0248014 A1* 9/2013 Kobayashi ........ H01L 21/67201
137/334

(Continued)

FOREIGN PATENT DOCUMENTS

JP  2010-123712 A1  6/2010
JP  2013-232640 A1  11/2013

(Continued)

OTHER PUBLICATIONS

English translation of International Preliminary Report on Patentability (Application No. PCT/JP2018/022504) dated Jan. 16, 2020.

(Continued)

*Primary Examiner* — Thienvu V Tran
*Assistant Examiner* — Carlos O Rivera-Perez
(74) *Attorney, Agent, or Firm* — Burr & Brown, PLLC

(57) ABSTRACT

A semiconductor manufacturing apparatus member in which an insulating electrostatic chuck having a wafer placement surface and provided with a narrow hole and a conductive cooling plate provided with a gas supply hole are bonded together, the member includes a plug chamber composed of at least one of an electrostatic chuck side recess and a cooling plate side recess, a porous insulating air permeable plug disposed in the plug chamber, an annular dense layer provided on the surface of the air permeable plug so as to separate the surface of the air permeable plug into a narrow hole side surface and a gas supply hole side surface and an adhesive layer filled between the dense layer and the wall surface of the plug chamber.

8 Claims, 6 Drawing Sheets

(58) Field of Classification Search
USPC .................................................. 361/230–235
See application file for complete search history.

(56) References Cited

U.S. PATENT DOCUMENTS

| | | |
|---|---|---|
| 2013/0286532 A1 | 10/2013 | Kataigi et al. |
| 2016/0276198 A1 | 9/2016 | Anada et al. |
| 2016/0352260 A1 | 12/2016 | Comendant |

FOREIGN PATENT DOCUMENTS

| | | |
|---|---|---|
| JP | 2013-232641 A1 | 11/2013 |
| JP | 2016-225616 A1 | 12/2016 |
| JP | 2018-101773 A1 | 6/2018 |
| KR | 10-2008-0037703 A | 4/2008 |
| WO | 2014/157571 A1 | 10/2014 |

OTHER PUBLICATIONS

International Search Report and Written Opinion (Application No. PCT/JP2018/022504) dated Aug. 21, 2018.
Japanese Office Action (Application No. 2018-552259) dated Jun. 11, 2019 (with English translation).
Taiwanese Office Action (Application No. 107120902) dated Apr. 26, 2021.
Korean Office Action (with English translation), Korean Application No. 10-2019-7011052, dated Mar. 28, 2022 (15 pages).

\* cited by examiner

SEMICONDUCTOR MANUFACTURING APPARATUS MEMBER AND METHOD FOR MANUFACTURING THE SAME

BACKGROUND OF THE INVENTION

1. Field of the Invention

The present invention relates to a semiconductor manufacturing apparatus member and a method for manufacturing the same.

2. Description of the Related Art

Conventionally, there is known a semiconductor manufacturing apparatus member in which an electrostatic chuck having a wafer placement surface is provided on a cooling plate. As such a semiconductor manufacturing apparatus member, there is also known one in which, for the purpose of removing heat from a wafer placed on the electrostatic chuck, backside gas such as helium (He) is flowed on the backside of the wafer. Such a semiconductor manufacturing apparatus member includes a gas supply hole that penetrates the cooling plate from a bonding surface bonded to the electrostatic chuck to a surface opposite to the bonding surface, a non-through hole that is formed in the electrostatic chuck from a surface facing the gas supply hole toward the wafer placement surface, a narrow hole that penetrates from the bottom surface of the non-through hole to the wafer placement surface, and an air permeable plug that is filled into the non-through hole (see, for example, PTL 1).

CITATION LIST

Patent Literature

PTL 1: JP 2013-232640

SUMMARY OF THE INVENTION

When disposing the air permeable plug in the non-through hole, adhesive slurry is applied to the outer peripheral surface of the air permeable plug, and then the air permeable plug is inserted into the non-through hole. However, in that case, there is a possibility that the adhesive slurry permeates the outer peripheral surface of the air permeable plug, the space between the air permeable plug and the recess cannot be completely filled with the adhesive layer, and a space penetrating the adhesive layer from the electrostatic chuck side to the cooling plate side is formed. If such a space is formed, discharge may occur between the wafer through this space during use. If discharge occurs between the wafer, a discharge mark is formed on the wafer, which not only generates particles and the like, but also destroys circuits on the wafer, which is undesirable.

The present invention has been made to solve such a problem, and it is a main object of the present invention to prevent discharge from occurring between a wafer in a semiconductor manufacturing apparatus member.

According to the present invention, there is provided a semiconductor manufacturing apparatus member in which an insulating electrostatic chuck having a wafer placement surface and provided with a narrow hole penetrating in the thickness direction and a conductive cooling plate provided with a gas supply hole penetrating in the thickness direction are bonded together.

The member includes a plug chamber composed of at least one of an electrostatic chuck side recess provided from a surface of the electrostatic chuck opposite to the wafer placement surface toward the wafer placement surface and a cooling plate side recess provided from a facing surface of the cooling plate facing the electrostatic chuck toward a surface opposite to the facing surface, a porous insulating air permeable plug disposed in the plug chamber, an annular dense layer provided on the surface of the air permeable plug so as to separate the surface of the air permeable plug into a narrow hole side surface including a part facing the narrow hole and not directly facing the cooling plate and a gas supply hole side surface including a part facing the gas supply hole, and an adhesive layer filled between the dense layer and the wall surface of the plug chamber.

Here, "dense" means having such a degree of denseness that the adhesive slurry is less likely to permeate compared with the porous part of the air permeable plug. It is more preferable to have such a degree of denseness that the adhesive slurry does not permeate.

In the semiconductor manufacturing apparatus member of the present invention, since at least a part of the surface of the air permeable plug that contacts the adhesive layer is a dense layer, the adhesive slurry is less likely to permeate the air permeable plug. Therefore, the space between the dense layer provided on the air permeable plug and the wall surface of the plug chamber can be filled with the adhesive layer so that a space connecting the narrow hole side space, which does not directly face the cooling plate, and the gas supply hole side space is not formed. In other words, it is possible to suppress the formation of a space that penetrates the adhesive layer from the electrostatic chuck side to the cooling plate side. Thus, it is possible to prevent discharge from occurring between the wafer in the semiconductor manufacturing apparatus member.

In the semiconductor manufacturing apparatus member of the present invention, the dense layer may be a heat-resistant resin film. In this case, the dense layer can be made relatively easily. The heat-resistant resin film may be a fluorine-based resin film or a polyimide-based resin film.

In the semiconductor manufacturing apparatus member of the present invention, the dense layer may be a thermal-sprayed film. In this case, the dense layer can be made relatively easily. The thermal-sprayed film may be made of the same material as that of the air permeable plug.

In the semiconductor manufacturing apparatus member of the present invention, the plug chamber may have at least the electrostatic chuck side recess, and the dense layer may be provided at a position on the side surface of the air permeable plug that faces the wall surface of the electrostatic chuck side recess. In this case, since the adhesive layer is annularly provided between the side surface of the air permeable plug and the wall face of the electrostatic chuck side recess, the air permeable plug is fixed to the plug chamber in a stable state.

In the semiconductor manufacturing apparatus member of the present invention, the plug chamber may be composed of the cooling plate side recess.

According to the present invention, there is provided a method for manufacturing the semiconductor manufacturing apparatus member, including the steps of:

(a) preparing the electrostatic chuck and the cooling plate before being bonded to each other and preparing the air permeable plug before being disposed in the plug chamber and before being provided with the dense layer;

(b) providing the air permeable plug with the dense layer, then applying adhesive slurry to the dense layer of the air permeable plug, then disposing the air permeable plug in a predetermined part that later becomes the plug chamber, and curing the adhesive slurry between the dense layer and the wall surface of the part to form the adhesive layer; and (c) bonding the electrostatic chuck and the cooling plate to each other.

In the method for manufacturing the semiconductor manufacturing apparatus member of the present invention, since, after the dense layer is provided on the surface of the air permeable plug, the adhesive slurry is applied to the dense layer of the air permeable plug, the adhesive slurry is less likely to permeate the air permeable plug. Therefore, when the air permeable plug to which the adhesive slurry is applied is disposed in a predetermined part that later becomes the plug chamber, and the semiconductor manufacturing apparatus member is assembled, the space between the dense layer provided on the air permeable plug and the wall surface of the plug chamber is filled with the adhesive layer so that a space connecting the narrow hole side space and the gas supply hole side space is not formed. In other words, it is possible to suppress the formation of a space that penetrates the adhesive layer from the electrostatic chuck side to the cooling plate side. Thus, it is possible to prevent discharge from occurring between the wafer in the semiconductor manufacturing apparatus member.

DETAILED DESCRIPTION OF THE INVENTION

Figure 1:
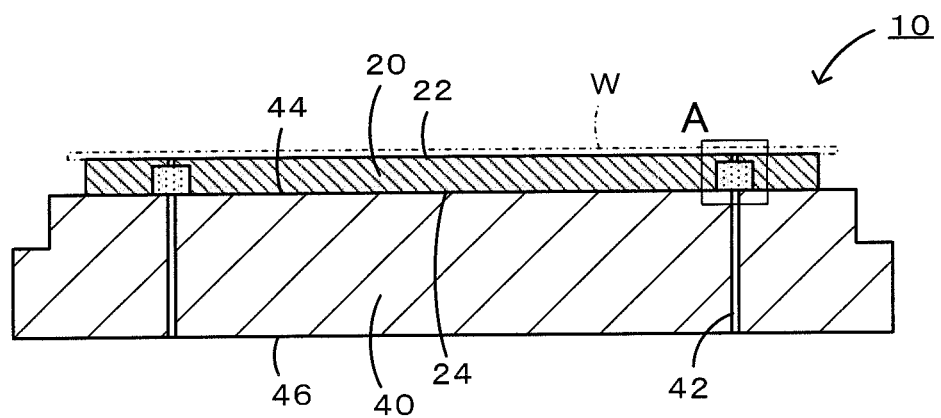
FIG. 1 is a longitudinal sectional view of a semiconductor manufacturing apparatus member 10.
Figure 2:
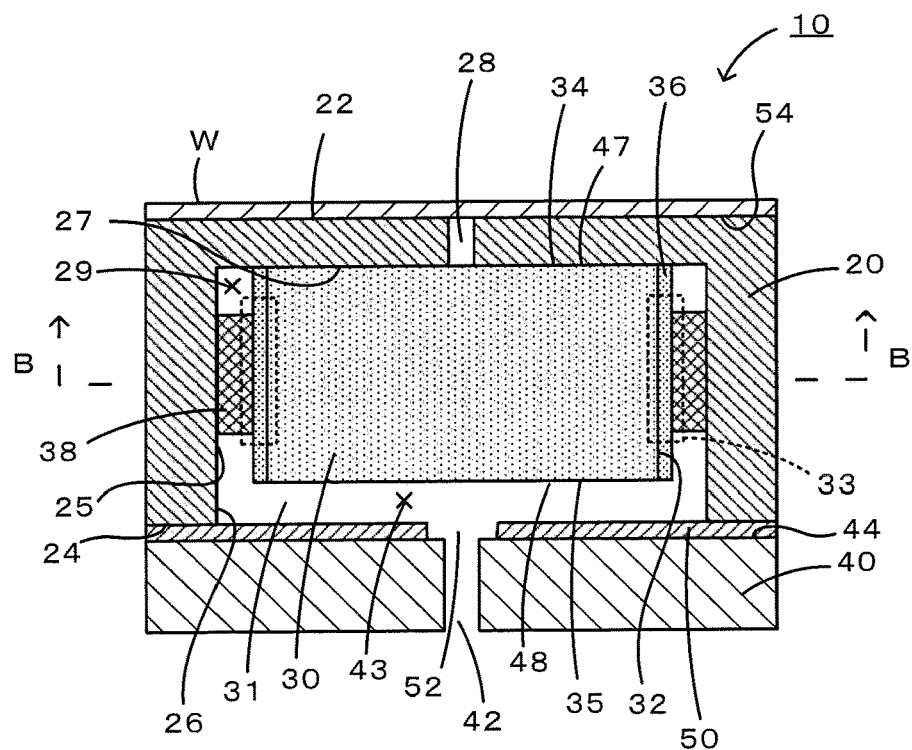
FIG. 2 is an enlarged view of a region A of FIG. 1.
Figure 3:
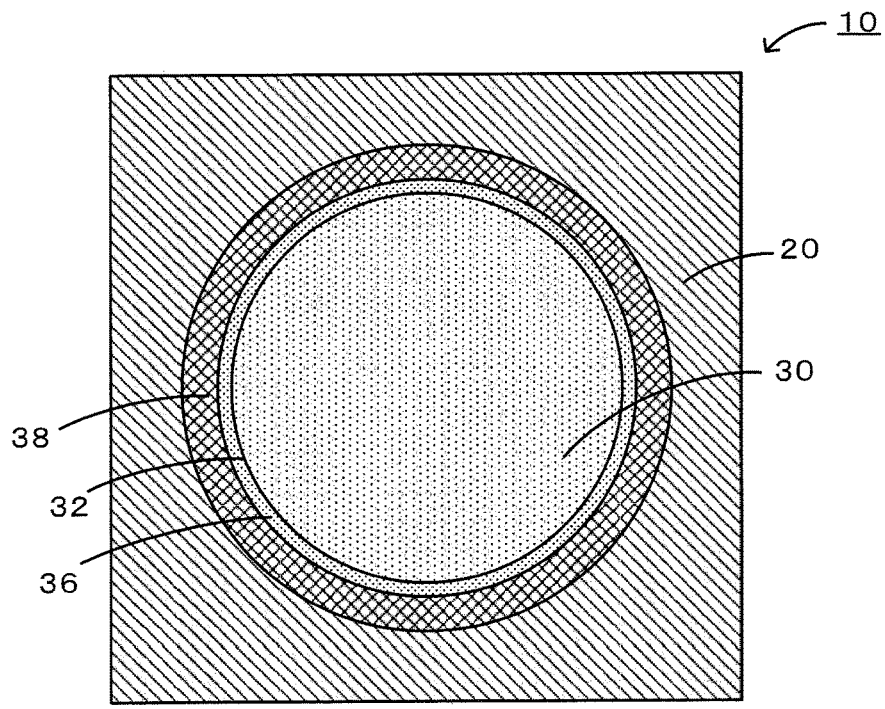
FIG. 3 is a sectional view taken along line B-B of FIG. 2.

A preferred embodiment of the present invention will be described with reference to the drawings. FIG. 1 is a longitudinal sectional view of a semiconductor manufacturing apparatus member 10, FIG. 2 is an enlarged view of part A of FIG. 1, and FIG. 3 is a sectional view taken along line B-B of FIG. 2 (a sectional view of a front view (overall view) of the semiconductor manufacturing apparatus member 10 taken along line B-B of FIG. 2).

The semiconductor manufacturing apparatus member 10 is a member in which an insulating electrostatic chuck 20 having a wafer placement surface 22 is provided on a conductive cooling plate 40. Inside the semiconductor manufacturing apparatus member 10, a plug chamber 31 is provided, and a porous air permeable plug 30 made of an insulating material is disposed. On the wafer placement surface 22, a wafer W to be subjected to plasma processing is placed.

The electrostatic chuck 20 is a dense disk-shaped member made of ceramics such as alumina, and an electrostatic electrode (not shown) is embedded therein. The electrostatic chuck 20 has a non-through hole (electrostatic chuck side recess) 26 and a narrow hole 28 communicating with the non-through hole 26. The non-through hole 26 is formed from a surface 24 opposite to the wafer placement surface 22 toward the wafer placement surface 22. The internal space of the non-through hole 26 has a cylindrical shape. The narrow hole 28 has a diameter smaller than that of the non-through hole 26 and penetrates from the wafer placement surface 22 to the upper bottom 27 of the non-through hole 26. In other words, the narrow hole 28 penetrates the electrostatic chuck 20 in the thickness direction.

The cooling plate 40 is a disk-shaped member made of metal such as aluminum, and has a gas supply hole 42. The gas supply hole 42 penetrates from a facing surface 44 of the cooling plate 40 that faces the electrostatic chuck 20 to a surface 46 that is opposite to the facing surface 44. The gas supply hole 42 is formed at a position facing the non-through hole 26, and the gas supply hole 42 communicates with the non-through hole 26.

The plug chamber 31 is formed by the non-through hole 26. Since the non-through hole 26 communicates with the narrow hole 28 and the gas supply hole 42, the plug chamber 31 also communicates with the narrow hole 28 and the gas supply hole 42.

The air permeable plug 30 is a cylindrical member made of a porous material. The air permeable plug 30 may be made by hardening finely crushed insulating ceramics with an inorganic adhesive such that it has air permeability. Alternatively, the air permeable plug 30 may be made of a porous body of ceramics. Further alternatively, the air permeable plug 30 may be made of glass fiber or a heat-resistant Teflon resin sponge. It is preferable that the air permeable plug 30 be made of a porous body of ceramics because it is easy to form very fine vent holes.

A dense layer 36 is annularly provided on the surface of the air permeable plug 30 so as to separate the surface of the air permeable plug 30 into a narrow hole side surface 47 that includes a part facing the narrow hole 28 and that does not directly face the cooling plate 40, and a gas supply hole side surface 48 that includes a part facing the gas supply hole 42. Here, the dense layer 36 is provided on the entire outer peripheral surface 32 of the air permeable plug 30. The dense layer 36 is less permeable to adhesive slurry than the porous part of the air permeable plug 30. The dense layer 36 is, for example, a heat-resistant resin film, a thermal-sprayed film, or the like provided on the air permeable plug 30. By adhering a heat-resistant resin film or forming a thermal-sprayed film, the dense layer 36 can be made relatively easily. The heat-resistant resin film is preferably a fluorine-based resin film such as Teflon (Teflon is a registered trademark) or a polyimide-based resin film. These are preferable because they have heat resistance of 200° C. or higher required for an electrostatic chuck and are less likely to generate gas even when used under vacuum. The thermal-sprayed film may be made of the same material as that of the air permeable plug 30. For example, if the air permeable plug 30 is made of alumina, the thermal-sprayed film may also be made of alumina. If they are made of the same material, the difference in thermal expansion is small, and cracking or peeling is less likely to occur between them even when subjected to thermal cycling. The thickness of the dense layer 36 is preferably such a degree that the air permeability of the air permeable plug 30 is not significantly impaired, for example, 1/10 or less of the diameter of the air permeable plug 30.

The adhesive layer 38 is filled between the dense layer 36 provided on the outer peripheral surface 32 of the air permeable plug 30 and the side surface (the wall surface of the plug chamber 31) 25 of the non-through hole 26 provided in the electrostatic chuck 20. The air permeable plug 30 and the non-through hole 26 are bonded to each other via the adhesive layer 38. Here, the adhesive layer 38 is provided on the entire outer periphery of the air permeable plug 30. By the adhesive layer 38, the space around the air permeable plug 30 is separated into the narrow hole side space 29 and the gas supply hole side space 43 so that the narrow hole side space 29 does not face the cooling plate 40. The adhesive layer 38 is made of, for example, an epoxy-based adhesive. These are preferable because they have heat resistance of 200° C. or higher required for an electrostatic chuck and are less likely to generate gas even when used under vacuum. An adhesive having a heat resistance of 200° C. or higher has a relatively low viscosity and easily permeates the inside of the air permeable plug 30 when the dense layer 36 is not provided.

The cooling plate 40 and the electrostatic chuck 20 are bonded to each other via an insulating bonding sheet 50. A through-hole 52 is formed in a part of the bonding sheet 50 that faces the gas supply hole 42.

The semiconductor manufacturing apparatus member 10 is installed in a chamber (not shown). Then, a wafer W is placed on the wafer placement surface 22, and a DC voltage is applied to the electrostatic electrode (not shown) so that the wafer W is attracted to the wafer placement surface 22. By introducing raw material gas into the chamber and applying an RF voltage for generating plasma to the cooling plate 40, plasma is generated and the wafer W is processed. At this time, backside gas such as helium is introduced from a gas cylinder (not shown) into the gas supply hole 42. The backside gas is supplied to the backside 54 of the wafer W through the gas supply hole 42, the air permeable plug 30 in the plug chamber 31, and the narrow hole 28.

Figure 4:
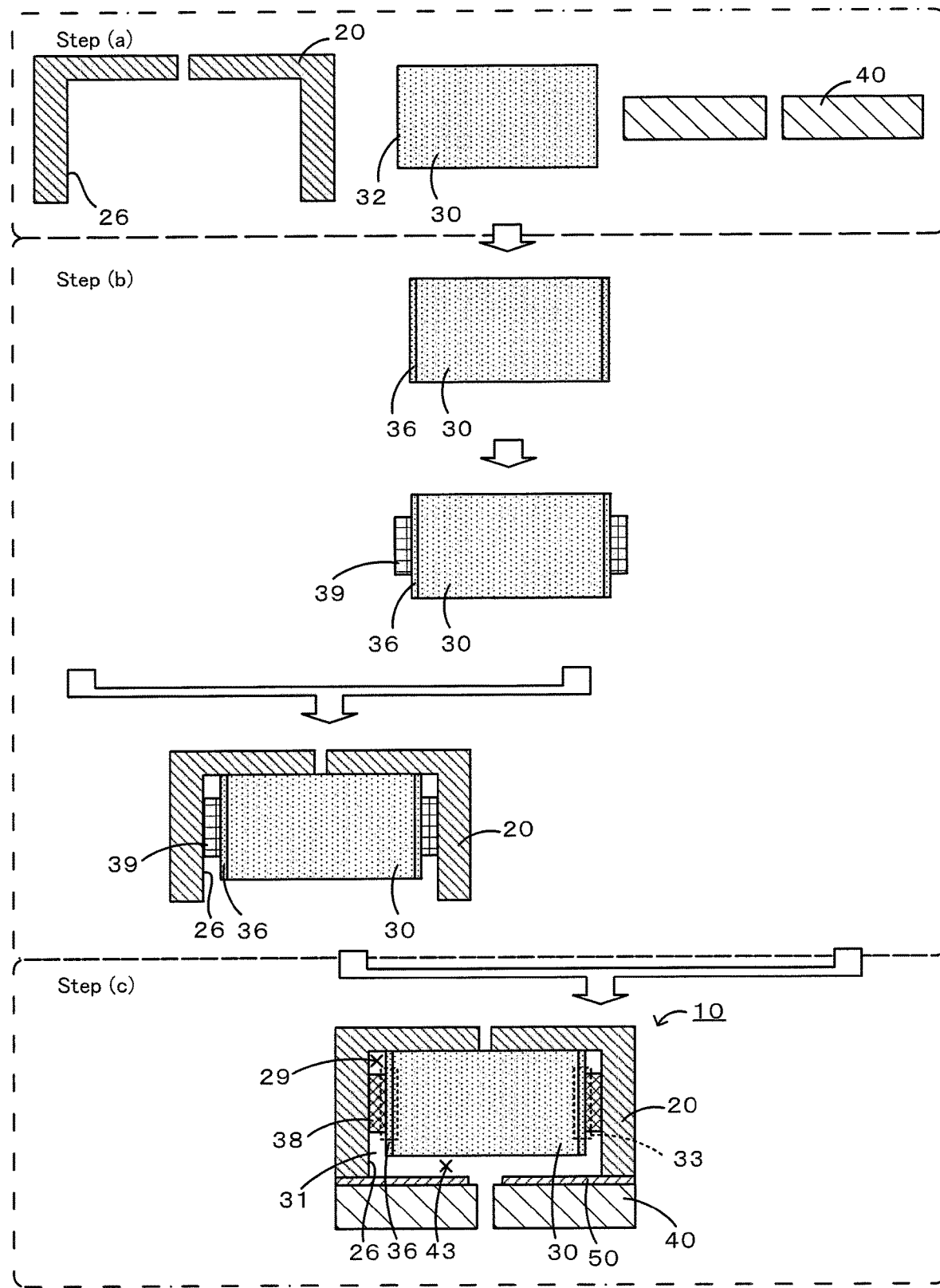
FIG. 4 is a manufacturing process diagram of the semiconductor manufacturing apparatus member 10.

Next, an example of a method for manufacturing the semiconductor manufacturing apparatus member 10 will be described with reference to FIG. 4. FIG. 4 is a manufacturing process diagram of the semiconductor manufacturing apparatus member 10. First, the electrostatic chuck 20 and the cooling plate 40 before being bonded to each other are prepared, and the air permeable plug 30 before being disposed in the plug chamber 31 and before being provided with the dense layer 36 is prepared (Step (a)). Next, after providing the air permeable plug 30 with the dense layer 36, adhesive slurry 39 is applied to the dense layer 36, and then the air permeable plug 30 is disposed in the non-through hole 26 which later becomes the plug chamber 31, and the adhesive slurry 39 between the dense layer 36 and the side surface 25 of the non-through hole 26 is cured to form the adhesive layer 38 (Step (b)). Next, the electrostatic chuck 20 and the cooling plate 40 are bonded to each other via the bonding sheet 50 (Step (c)). In the semiconductor manufacturing apparatus member 10 thus obtained, at least a part in contact with the adhesive layer 38 (referred to as an adhesive layer contact part 33) is dense.

Preferable examples of the method for providing the dense layer 36 include a method in which the surface of the air permeable plug 30 is covered with a heat-resistant resin tube or sheet and the heat-resistant resin film is adhered by heating with hot air or heating in a furnace, and a method in which a thermal-sprayed film is formed on the surface of the air permeable plug 30 by thermal spraying. A method in which highly viscous heat-resistant resin slurry is applied to the surface of the air permeable plug 30 to adhere the heat-resistant resin film may be used, but a method using a heat-resistant resin tube or sheet or thermal spraying is preferable because the material of the dense layer 36 is less likely to permeate the air permeable plug 30. The heat-resistant resin tube or sheet is preferably a heat shrinkable tube or a heat shrinkable sheet because the heat-resistant resin film can be more easily adhered to the outer peripheral surface of the air permeable plug 30. The heat-resistant resin tube or sheet is preferably made of a fluorine-based resin such as Teflon or a polyimide-based resin, and more preferably made of a fluorine-based resin. The thermal spraying material may be the same material as that of the air permeable plug 30. For example, if the air permeable plug 30 is made of alumina, the thermal-sprayed film may also be made of alumina. The adhesive slurry 39 is, for example, an epoxy-based adhesive.

According to the semiconductor manufacturing apparatus member 10 of the present embodiment described above, since at least a part of the surface of the air permeable plug 30 that contacts the adhesive layer 38 is the dense layer 36, the adhesive slurry is less likely to permeate the air permeable plug 30. Therefore, the space between the dense layer 36 provided on the air permeable plug 30 and the wall surface of the plug chamber 31 can be filled with the adhesive layer 38 so that a space connecting the narrow hole side space 29, which does not directly face the cooling plate 40, and the gas supply hole side space 43 is not formed. In other words, a space that penetrates the adhesive layer 38 from the electrostatic chuck 20 side to the cooling plate 40 side is prevented from being formed, and the discharge path is blocked by the adhesive layer 38. Thus, it is possible to prevent discharge from occurring between the wafer W in the semiconductor manufacturing apparatus member 10.

According to the method for manufacturing the semiconductor manufacturing apparatus member 10 of the present embodiment, since the dense layer 30 is provided on at least a part of the surface of the air permeable plug 30 that contacts the adhesive layer 38 and then the adhesive slurry 36 is applied to the dense layer 39, the adhesive slurry 39 is less likely to permeate the air permeable plug 30. Therefore, when the air permeable plug 30 to which the adhesive slurry 39 is applied is disposed in the non-through hole 26, which later becomes the plug chamber 31, and the semiconductor manufacturing apparatus member 10 is assembled, the space between the dense layer 36 provided on the air permeable plug 30 and the wall surface of the plug chamber 31 is filled with the adhesive layer 38 so that a space connecting the narrow hole side space 29 and the gas supply hole side space 43 is not formed. In other words, it is possible to suppress the formation of a space that penetrates the adhesive layer 38 from the electrostatic chuck 20 side to the cooling plate 40 side. Thus, it is possible to prevent discharge from occurring between the wafer W in the semiconductor manufacturing apparatus member 10.

It should be noted that the present invention is not limited to the above-described embodiment at all, and it is needless to say that the present invention can be implemented in various embodiments without departing from the technical scope of the present invention.

Figures 5, 6:
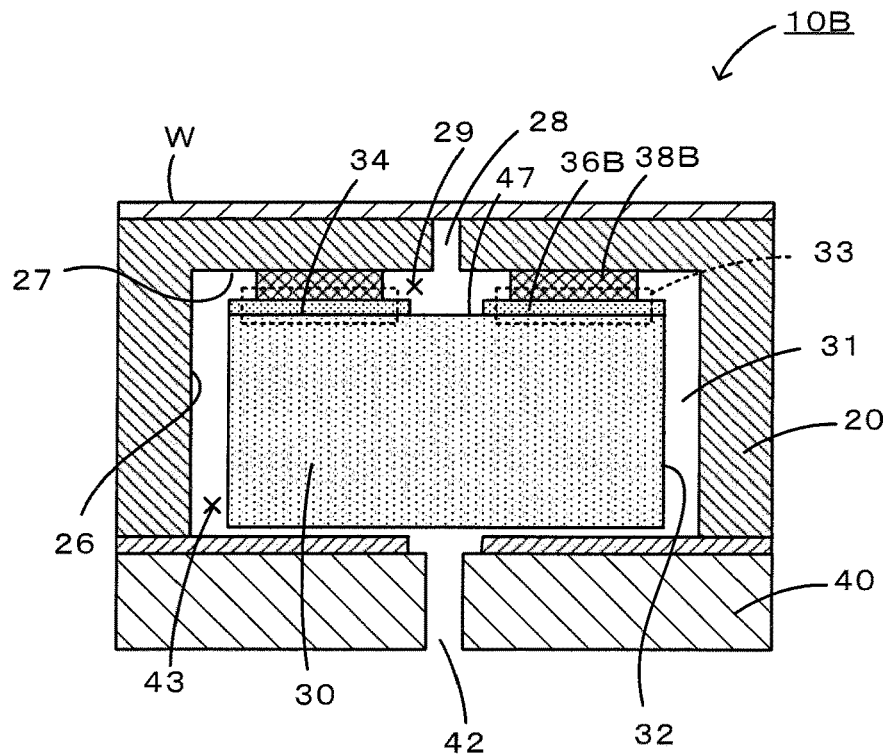
FIG. 5 is an enlarged view corresponding to FIG. 2 of a semiconductor manufacturing apparatus member 10B.
FIG. 6 is an enlarged view corresponding to FIG. 2 of a semiconductor manufacturing apparatus member 10C.

For example, in the above-described embodiment, the dense layer 36 is provided on the outer peripheral surface 32 of the air permeable plug 30, but may be provided on the upper surface 34 of the air permeable plug 30 as shown in FIG. 5. FIG. 5 is an enlarged view corresponding to FIG. 2 of a semiconductor manufacturing apparatus member 10B that is another example of the semiconductor manufacturing apparatus member 10. In FIG. 5, the same components as those of the semiconductor manufacturing apparatus member 10 are denoted by the same reference numerals, and description thereof will be omitted (the same applies to the following other examples). Here, the dense layer 36B is annularly provided on the upper surface 34 of the air permeable plug 30 so as to surround a part facing the narrow hole 28. The adhesive layer 38B is filled between the dense layer 36B provided on the upper surface 34 of the air permeable plug 30 and the upper bottom (wall surface of the plug chamber 31) 27 of the non-through hole 26 provided in the electrostatic chuck 20. By the adhesive layer 38B, the space around the air permeable plug 30 is separated into the narrow hole side space 29 and the gas supply hole side space 43 so that the narrow hole side space 29 and the narrow hole side surface 47 do not face the cooling plate 40. In the semiconductor manufacturing apparatus member 10B, as in the above-described embodiment, discharge can be prevented from occurring between the wafer.

For example, in the above-described embodiment, the dense layer 36 is provided on the outer peripheral surface 32 of the air permeable plug 30, but may be provided on the lower surface 35 of the air permeable plug 30 as shown in FIG. 6. FIG. 6 is an enlarged view corresponding to FIG. 2 of a semiconductor manufacturing apparatus member 10C that is another example of the semiconductor manufacturing apparatus member 10. Here, the dense layer 36C is annularly provided on the lower surface 35 of the air permeable plug 30 so as to surround a part facing the gas supply hole 42. The adhesive layer 38C is filled between the dense layer 36C provided on the lower surface 35 of the air permeable plug 30 and the facing surface (wall surface of the plug chamber 31) 44 of the cooling plate 40. By this adhesive layer 38C, the space around the air permeable plug 30 is separated into the narrow hole side space 29 and the gas supply hole side space 43. Since an insulating bonding sheet 50 is provided between the narrow hole side space 29 and the cooling plate 40, the narrow hole side space 29 and the narrow hole side surface 47 do not directly face the cooling plate 40. In the semiconductor manufacturing apparatus member 10C, as in the above-described embodiment, discharge can be prevented from occurring between the wafer.

Figure 7:
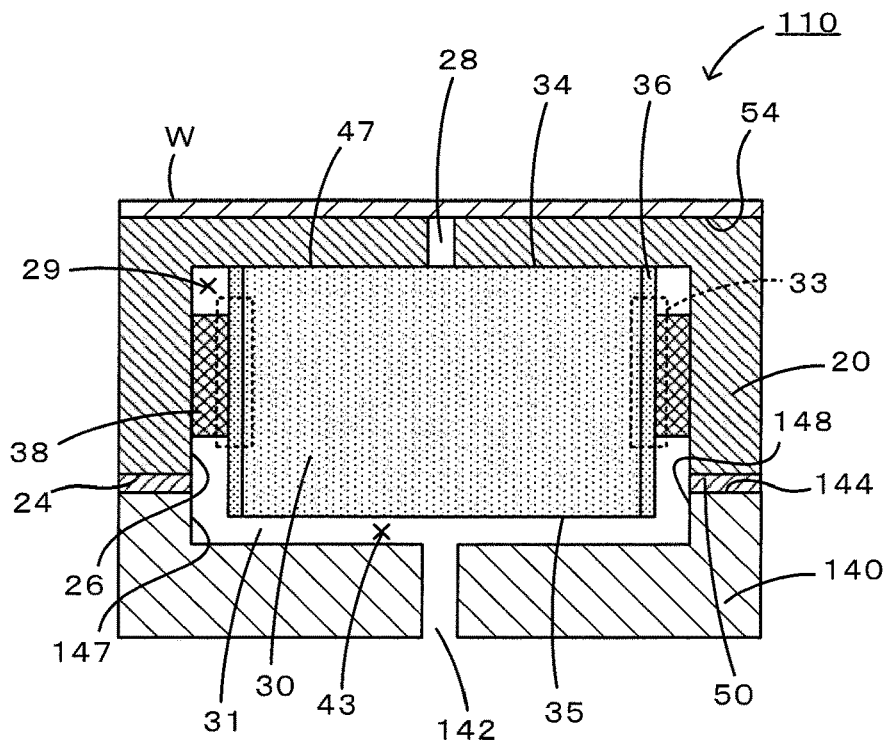
FIG. 7 is an enlarged view corresponding to FIG. 2 of a semiconductor manufacturing apparatus member 110.

For example, in the above-described embodiment, the plug chamber 31 is composed of a non-through hole 26 provided in the electrostatic chuck 20, but it may also be composed of a non-through hole 26 provided in the electrostatic chuck 20 and a non-through hole (cooling plate side recess) 148 provided in the cooling plate 140, as shown in FIG. 7. FIG. 7 is an enlarged view corresponding to FIG. 2 of a semiconductor manufacturing apparatus member 110 that is another example of the semiconductor manufacturing apparatus member 10. In the semiconductor manufacturing apparatus member 10B, as in the above-described embodiment, discharge can be prevented from occurring between the wafer. In the semiconductor manufacturing apparatus member 110, the dense layer 36 and the adhesive layer 38 may be provided on the upper surface 34 of the air permeable plug 30 as in the example shown in FIG. 5.

Figure 8:
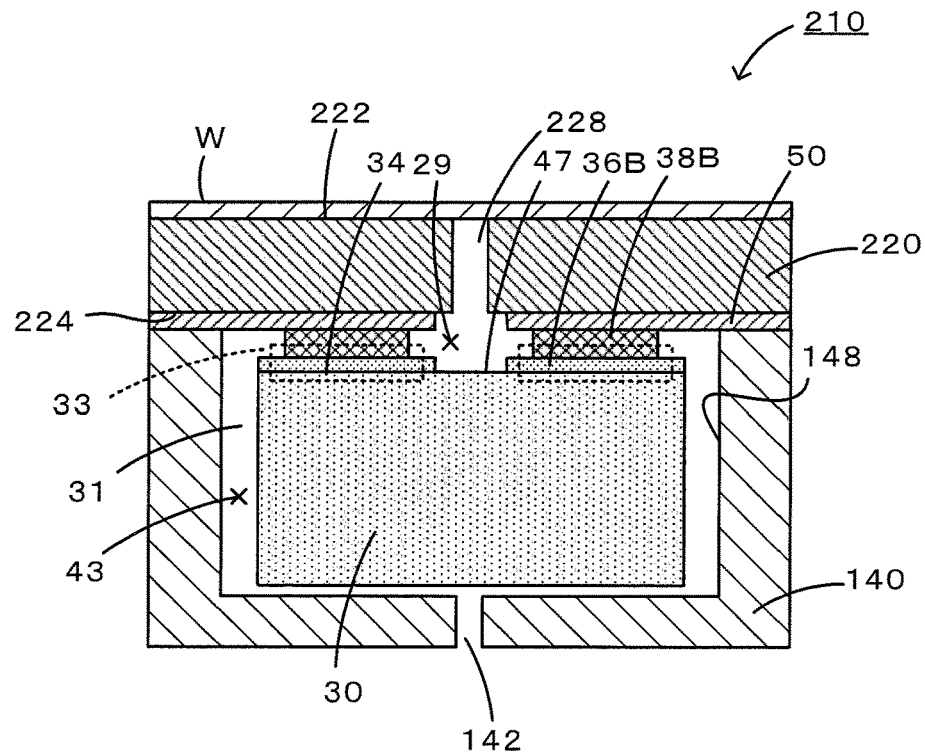
FIG. 8 is an enlarged view corresponding to FIG. 2 of a semiconductor manufacturing apparatus member 210.

For example, in the above-described embodiment, the plug chamber 31 is composed of a non-through hole 26 provided in the electrostatic chuck 20, but as shown in FIG. 8, instead of the non-through hole 26 provided in the electrostatic chuck 20, the plug chamber 31 may also be composed of a non-through hole 148 provided in the cooling plate 140. FIG. 8 is an enlarged view corresponding to FIG. 2 of a semiconductor manufacturing apparatus member 210 that is another example of the semiconductor manufacturing apparatus member 10. In the semiconductor manufacturing apparatus member 210, the dense layer 36B is annularly provided on the upper surface 34 of the air permeable plug 30 so as to surround a part facing the narrow hole 228. The adhesive layer 38B is filled between the dense layer 36 provided on the upper surface 34 of the air permeable plug 30 and a surface (wall surface of the plug chamber 31) 224 of the electrostatic chuck 220 that is opposite to the wafer placement surface 222. By the adhesive layer 38B, the space around the air permeable plug 30 is separated into the narrow hole side space 29 and the gas supply hole side space 43 so that the narrow hole side space 29 and the narrow hole side surface 47 do not face the cooling plate 140. In the semiconductor manufacturing apparatus member 210, as in the above-described embodiment, discharge can be prevented from occurring between the wafer. In FIG. 8, the insulating bonding sheet 50 is provided on the surface 224 also in the part other than the bonding part between the cooling plate 140 and the electrostatic chuck 220. However, the bonding sheet 50 in this part may be omitted.

For example, in the above-described embodiment, the dense layer 36 is provided on the entire outer peripheral surface 32 of the air permeable plug 30, but the dense layer 36 may be provided at least on a part of the surface of the air permeable plug 30 that contacts the adhesive layer 38, or the dense layer 36 may be provided only on the surface facing the adhesive layer 38. Although the dense layer 36 is provided on the entire outer peripheral surface 32 of the air permeable plug 30, the dense layer 36 may be provided at least on a part of the surface of the air permeable plug 30 that contacts the adhesive slurry 39, or the dense layer 36 may be provided only on the surface facing the adhesive slurry 39. Also in this way, it is possible to suppress the formation of a space that penetrates the adhesive layer 38 from the electrostatic chuck 20 side to the cooling plate 40 side. The dense layer may also be provided on the upper surface 34 and the lower surface 35 of the air permeable plug 30 except for parts facing the narrow hole 28 and the gas supply hole 42. In such a case, since the area of the dense layer is increased, the air permeability may be somewhat inferior. However, by providing the adhesive layer on the dense layer, it is possible to further suppress the formation of a space that penetrates the adhesive layer 38 from the electrostatic chuck 20 side to the cooling plate 40 side. Such an embodiment can also be applied to the examples of FIGS. 5 to 8 (hereinafter the same applies).

For example, in the above-described embodiment, the dense layer 36 is a dense film provided on the air permeable plug 30, but when making the air permeable plug 30, the pore diameter of the adhesive layer contact part 33 may be small, and the pore diameter of the part other than the adhesive layer contact part 33 may be large. For example, it is also possible to prepare a clay containing an aggregate such as an inorganic material and a pore former such as a resin, and to mold such that a clay containing a pore former having a small particle size (or not containing a pore former) is disposed in the adhesive layer contact part 33, and a clay containing a pore former having a large particle size is disposed in the other parts, and to fire. By doing so, the pore formers disappear by firing, and an air permeable plug 30 is obtained in which a dense layer having a small pore diameter is formed in the adhesive layer contact part 33 and a porous part having a large pore diameter is formed in the other parts.

As described above, the dense layer 36 can also be provided by integral molding and integral firing with the porous part.

For example, in the above-described embodiment, a non-through hole (a hole formed afterward) is exemplified as the recess, but the recess is not particularly limited to a non-through hole. For example, when making a molded body of an electrostatic chuck, the molded body may be molded so as to have a recess, and then fired to form a ceramic. Alternatively, when making a cooling plate by casting in a mold, a mold such that the cast cooling plate has a recess may be used.

Figure 9:
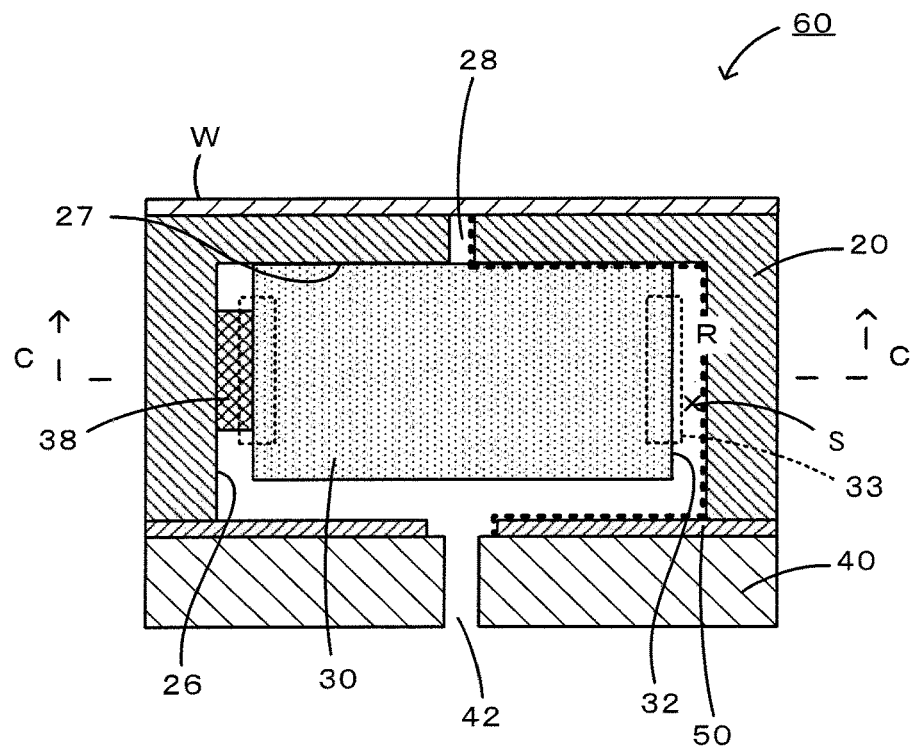
FIG. 9 is an enlarged view corresponding to FIG. 2 of a semiconductor manufacturing apparatus member 60 of a comparative embodiment.
Figure 10:
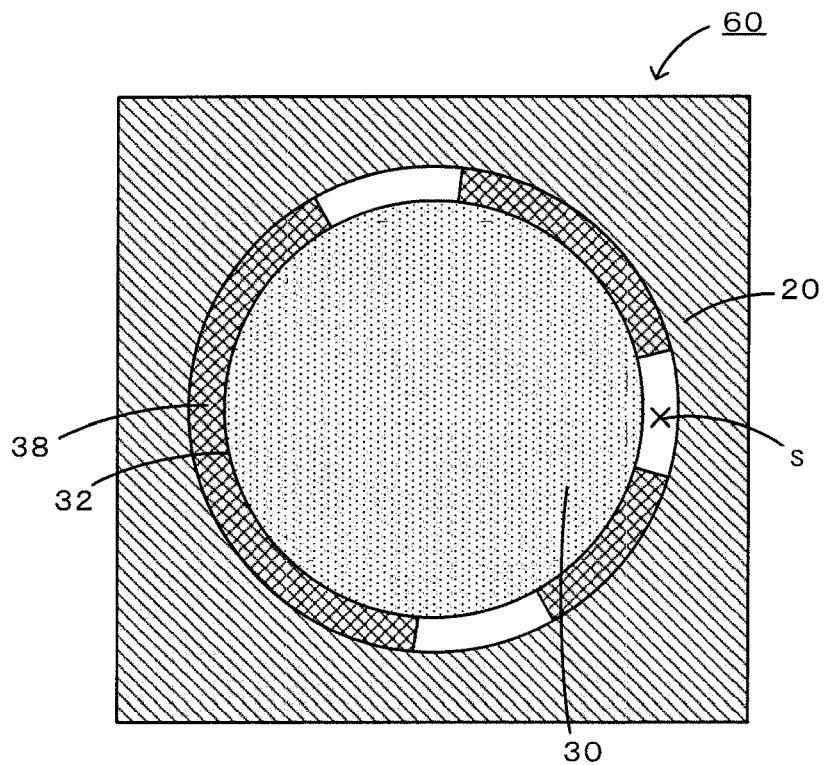
FIG. 10 is a sectional view taken along line C-C of FIG. 9.

For comparison with the above-described embodiment, a case where a semiconductor manufacturing apparatus member not provided with the dense layer 36 (referred to as a comparative embodiment) is used will be described with reference to FIGS. 9 and 10. FIG. 9 is an enlarged view corresponding to FIG. 2 of a semiconductor manufacturing apparatus member 60 of the comparative embodiment, and FIG. 10 is a sectional view taken along line C-C of FIG. 9. The same reference numerals will be used for describing the same components as those of the semiconductor manufacturing apparatus member 10. In the semiconductor manufacturing apparatus member 60 of the comparative embodiment, the dense layer 36 is not provided on the outer peripheral surface 32 of the air permeable plug 30. Therefore, although, when the air permeable plug 30 is inserted into the non-through hole 26, the space between the outer peripheral surface 32 and the non-through hole 26 is completely filled with the adhesive slurry, the adhesive slurry thereafter permeates the air permeable plug 30, and a part not filled with the adhesive slurry is formed between the air permeable plug 30 and the non-through hole 26. When the adhesive slurry is cured in this state, there is a possibility that the space between the air permeable plug 30 and the non-through hole 26 cannot be completely filled with the adhesive layer 38, and a space S penetrating the adhesive layer 38 from the electrostatic chuck 20 side to the cooling plate 40 side is formed. If such a space S is formed, discharge along the discharge path R (see the dotted line) may occur between the cooling plate 40 and the wafer W through this space S during use. If discharge occurs between the wafer W, a discharge mark is formed on the wafer W, which not only generates particles and the like, but also destroys circuits on the wafer W, which is undesirable. In the above-described embodiment, since the discharge path R is blocked by the adhesive layer 38, discharge can be prevented from occurring.

This application claims the priority of Japanese Patent Application No. 2017-132363, filed on Jul. 6, 2017, the entire contents of which are incorporated herein by reference in their entirety.

What is claimed is:

1. A semiconductor manufacturing apparatus member in which an insulating electrostatic chuck having a wafer placement surface and provided with a narrow hole penetrating in the thickness direction and a conductive cooling plate provided with a gas supply hole penetrating in the thickness direction are bonded together, the semiconductor manufacturing apparatus member comprising:

a plug chamber composed of at least one of an electrostatic chuck side recess provided from a surface of the insulating electrostatic chuck opposite to the wafer placement surface toward the wafer placement surface and a cooling plate side recess provided from a facing surface of the conductive cooling plate facing the insulating electrostatic chuck toward a surface opposite to the facing surface;

a porous insulating air permeable plug disposed in the plug chamber;

an annular dense layer provided on the surface of the porous insulating air permeable plug so as to separate the surface of the porous insulating air permeable plug into a narrow hole side surface including a part facing the narrow hole and not directly facing the conductive cooling plate and a gas supply hole side surface including a part facing the gas supply hole;

an adhesive layer filled between the annular dense layer and the wall surface of the plug chamber; and wherein the porous insulating air permeable plug is a cylindrical member; and wherein the adhesive layer forms a space between a surface of the adhesive layer facing the narrow hole side surface and the narrow hole side surface.

2. The semiconductor manufacturing apparatus member according to claim 1, wherein the annular dense layer is a heat-resistant resin film.

3. The semiconductor manufacturing apparatus member according to claim 2, wherein the heat-resistant resin film is a fluorine-based resin film or a polyimide-based resin film.

4. The semiconductor manufacturing apparatus member according to claim 1, wherein the annular dense layer is a thermal-sprayed film.

5. The semiconductor manufacturing apparatus member according to claim 4, wherein the thermal-sprayed film is made of the same material as that of the porous insulating air permeable plug.

6. The semiconductor manufacturing apparatus member according to claim 1, wherein the plug chamber has at least the electrostatic chuck side recess, and wherein the annular dense layer is provided at a position on the side surface of the porous insulating air permeable plug that faces the wall surface of the electrostatic chuck side recess.

7. The semiconductor manufacturing apparatus member according to claim 1, wherein the plug chamber is composed of the cooling plate side recess.

8. A method for manufacturing the semiconductor manufacturing apparatus member according to claim 1, the method comprising the steps of:

(a) preparing the insulating electrostatic chuck and the conductive cooling plate before being bonded to each other and preparing the porous insulating air permeable plug before being disposed in the plug chamber and before being provided with the annular dense layer;

(b) providing the porous insulating air permeable plug with the annular dense layer, then applying adhesive slurry to the annular dense layer of the porous insulating air permeable plug, then disposing the porous insulating air permeable plug in a predetermined part that later becomes the plug chamber, and curing the adhesive slurry between the annular dense layer and the wall surface of the part to form the adhesive layer; and (c) bonding the insulating electrostatic chuck and the conductive cooling plate to each other.

* * * * *